United States Patent
Otani

(10) Patent No.: US 10,128,444 B2
(45) Date of Patent: Nov. 13, 2018

(54) THIN-FILM PLANARIZATION METHOD, PLANARIZED THIN-FILM FORMATION METHOD, AND THIN-FILM FORMATION VARNISH

(71) Applicant: NISSAN CHEMICAL INDUSTRIES, LTD., Tokyo (JP)

(72) Inventor: Naoki Otani, Funabashi (JP)

(73) Assignee: NISSAN CHEMICAL INDUSTRIES, LTD., Tokyo (JP)

( * ) Notice: Subject to any disclaimer, the term of this patent is extended or adjusted under 35 U.S.C. 154(b) by 0 days.

(21) Appl. No.: 15/314,584

(22) PCT Filed: May 27, 2015

(86) PCT No.: PCT/JP2015/065278
§ 371 (c)(1),
(2) Date: Nov. 29, 2016

(87) PCT Pub. No.: WO2015/182667
PCT Pub. Date: Dec. 3, 2015

(65) Prior Publication Data
US 2017/0213979 A1    Jul. 27, 2017

(30) Foreign Application Priority Data
May 30, 2014   (JP) .................. 2014-112273

(51) Int. Cl.
*H01L 51/00*    (2006.01)
*C09D 5/24*     (2006.01)
(Continued)

(52) U.S. Cl.
CPC .......... *H01L 51/0058* (2013.01); *B05D 1/005* (2013.01); *B05D 1/02* (2013.01);
(Continued)

(58) Field of Classification Search
None
See application file for complete search history.

(56) References Cited

U.S. PATENT DOCUMENTS 5,710,224 A * 1/1998 Alt .................... B01J 31/143
                                                    526/132
6,153,716 A * 11/2000 Welch ................. C08F 10/02
                                                    526/348.6
(Continued)

FOREIGN PATENT DOCUMENTS

CN     101101442 A     1/2008
CN     104203996 A     12/2014
(Continued)

OTHER PUBLICATIONS

International Search Report, issued in PCT/JP2015/065278 (PCT/ISA/210), dated Aug. 25, 2015.
(Continued)

*Primary Examiner* — Erma C Cameron
(74) *Attorney, Agent, or Firm* — Birch, Stewart, Kolasch & Birch, LLP

(57) ABSTRACT

Provided are a thin-film planarization method, a planarized thin-film formation method, and a thin-film formation varnish to be used in these methods, in which when forming a thin film using a thin-film formation varnish which includes an organic compound and an organic solvent, the varnish flow activation energy is set to no more than 28 kJ/mol.

16 Claims, 1 Drawing Sheet

(51) Int. Cl.
  *B05D 1/00*    (2006.01)
  *B05D 1/18*    (2006.01)
  *B05D 1/02*    (2006.01)
  *B05D 1/28*    (2006.01)
  *H01L 51/50*    (2006.01)

(52) U.S. Cl.
  CPC .............. *B05D 1/18* (2013.01); *B05D 1/28* (2013.01); *C09D 5/24* (2013.01); *H01L 51/0005* (2013.01); *H01L 51/0007* (2013.01); *H01L 51/0026* (2013.01); *H01L 51/0059* (2013.01); *H01L 51/5088* (2013.01)

(56) References Cited

U.S. PATENT DOCUMENTS

| | | | |
|---|---|---|---|
| 2004/0044155 A1* | 3/2004 | Chai | C08F 210/16 526/170 |
| 2008/0029742 A1 | 2/2008 | Yoshimoto et al. | |
| 2009/0000508 A1 | 1/2009 | Edison et al. | |
| 2010/0159279 A1 | 6/2010 | Kato et al. | |
| 2010/0249328 A1* | 9/2010 | Nozue | C08L 23/04 525/240 |
| 2014/0227815 A1 | 8/2014 | Nakaie et al. | |
| 2015/0017365 A1 | 1/2015 | Sohn et al. | |

FOREIGN PATENT DOCUMENTS

| | | |
|---|---|---|
| JP | 5-25419 A | 2/1993 |
| JP | 10-53737 A | 2/1998 |
| JP | 2002-338861 A | 11/2002 |
| JP | 2003-340337 A | 12/2003 |
| JP | 2003-347050 A | 12/2003 |
| JP | 2008-507598 A | 3/2008 |
| JP | 2012-69507 A | 4/2012 |
| WO | WO 2006/025342 A1 | 3/2006 |
| WO | WO 2008/032616 A1 | 3/2008 |
| WO | WO 2010/058777 A1 | 5/2010 |
| WO | WO 2013/042623 A1 | 3/2013 |

OTHER PUBLICATIONS

Written Opinion of the International Searching Authority, issued in PCT/JP2015/065278 (PCT/ISA/237), dated Aug. 25, 2015.
Machine English translation of JP 2008-33206 A (Feb. 14, 2008).
Office Action dated Oct. 10, 2017, in Chinese Patent Application No. 201580028737.7.
Japanese Office Action issued in corresponding Japanese Application No. 2016-523538 and dated Sep. 11, 2018.

* cited by examiner

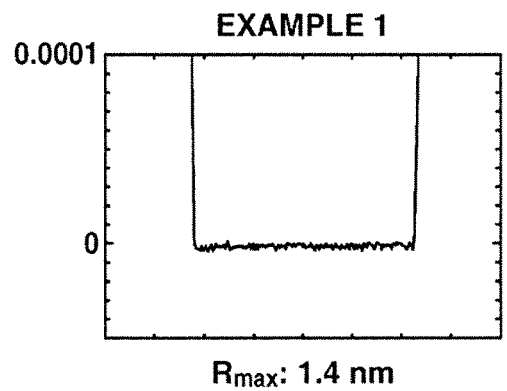
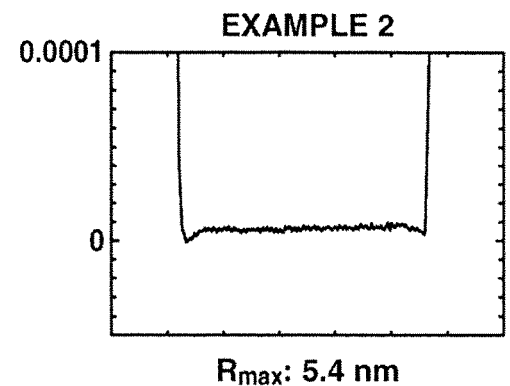
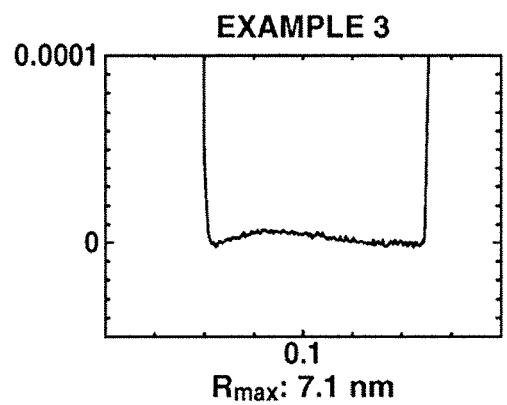
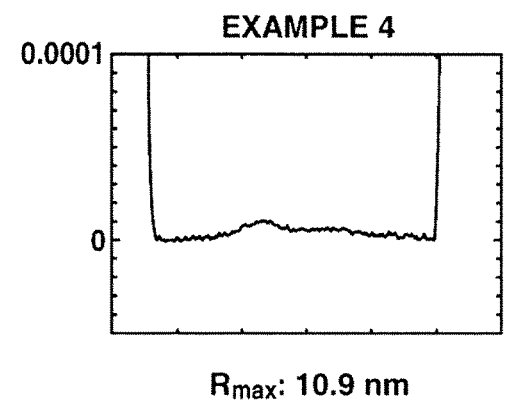
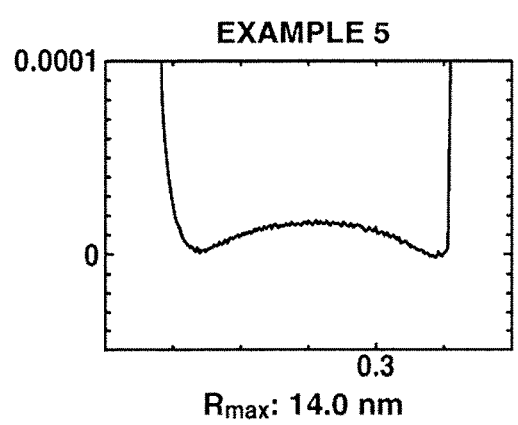
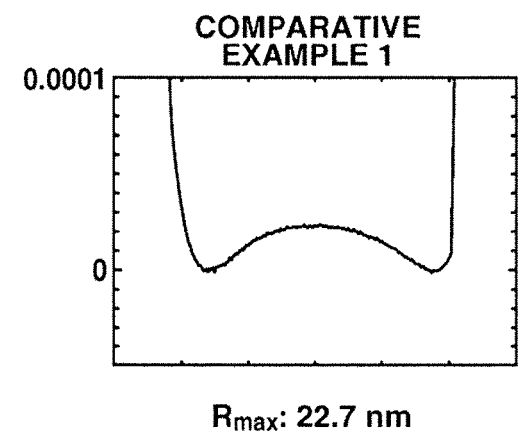

THIN-FILM PLANARIZATION METHOD, PLANARIZED THIN-FILM FORMATION METHOD, AND THIN-FILM FORMATION VARNISH

TECHNICAL FIELD

This invention relates to a thin film-planarizing method, a method of forming a planarized thin film, and a thin film-forming varnish.

BACKGROUND ART

When organic compounds, particularly polymers or oligomers, are used as electronic device materials, they are often employed in the form of thin films. Examples include insulating films, charge-transporting films, protective films and planarized films.

Organic electroluminescent (EL) devices are expected to see practical application in such fields as displays and lighting, and so various research is being carried out on materials and device structures with the aim of achieving such properties as low-voltage driving, high brightness, and longevity.

A plurality of functional thin films are used in organic EL devices. One such thin film—the hole injection layer, is responsible for transferring charge between an anode and a hole-transporting layer or an emissive layer, and thus serves an important function in achieving low-voltage driving and high brightness in organic EL devices.

Processes for forming the hole injection layer are broadly divided into dry processes such as vapor deposition and wet processes such as spin coating. Comparing these processes, wet processes are better able to efficiently produce thin films having a high flatness over a large surface area and therefore are often used particularly in the field of displays.

In light of these circumstances, the inventor and others have developed various types of charge-transporting varnishes containing aniline derivatives or the like as charge-transporting substances (see Patent Documents 1 to 4). However, improvements in the wet process materials for hole injection layers are constantly being sought. In particular, because they can help improve the brightness characteristics or longevity characteristics of organic EL devices, there is a growing desire for materials which provide charge-transporting thin-films of excellent flatness.

PRIOR ART DOCUMENTS

Patent Documents

Patent Document 1: WO 2006/025342
Patent Document 2: WO 2008/032616
Patent Document 3: WO 2010/058777
Patent Document 4: WO 2013/042623

SUMMARY OF THE INVENTION

Problems to be Solved by the Invention

Accordingly, the object of this invention is to provide a method for providing a thin film having a good flatness, a method of forming such a thin film, and a varnish that is capable of forming such a thin film.

Means for Solving the Problems

The inventor has conducted extensive investigations, as a result of which he has discovered that, when using a thin film-forming varnish containing an organic compound and an organic solvent to form a thin film, by setting the flow activation energy of the varnish to not more than a specific value, the flatness of the resulting thin film, such as the flatness of the film within a pixel when employed in a pixel substrate with banks, can be enhanced.

Accordingly, the invention provides the following thin film-planarizing method, method of forming a planarized thin film, and thin film-forming varnish.

1. A method of planarizing a thin film formed using a thin film-forming varnish containing an organic compound and an organic solvent, which method is characterized by setting the varnish to a flow activation energy of not more than 28 kJ/mol.
2. A method of planarizing a thin film produced from a thin film-forming varnish containing an organic compound and an organic solvent, which method is characterized in that the varnish used has a flow activation energy of not more than 28 kJ/mol.
3. The thin film-planarizing method of 1 or 2 above, wherein the organic compound has a molecular weight of from 200 to 30,000.
4. A planarized thin film-forming method comprising the steps of coating a substrate with a thin film-forming varnish containing an organic compound and an organic solvent, and evaporating off the solvent, wherein the varnish has a flow activation energy of not more than 28 kJ/mol.
5. The planarized thin film-forming method of 4 above, wherein the organic compound has a molecular weight of from 200 to 30,000.
6. A thin film-forming varnish which contains an organic compound and an organic solvent, and which has a flow activation energy of not more than 28 kJ/mol.
7. The thin film-forming varnish of 6 above, wherein the organic compound has a molecular weight of from 200 to 30,000.

Advantageous Effects of the Invention

This invention makes it possible to form a thin film having a high flatness within a small region of, for example, a pixel substrate with banks, without the addition of additives such as a leveling agent.

BRIEF DESCRIPTION OF THE DIAGRAM

The FIGURE shows film profiles within pixels when the varnishes of Working Examples 1 to 5 and Comparative Example 1 were coated onto a pixel substrate having a short axis of 50 μm.

EMBODIMENT FOR CARRYING OUT THE INVENTION

The inventive method of planarizing a thin film is characterized by, when using a thin film-forming varnish containing an organic compound and an organic solvent to form a thin-film, setting the varnish to a flow activation energy of not more than 28 kJ/mol.

The flow activation energy is represented by E (kJ/mol) in Andrade's formula:

$$\eta = A \cdot \exp(E/RT)$$

Andrade's formula is a formula representing the relationship between viscosity and temperature; the lower the flow activation energy, the smaller the temperature dependence of the viscosity. In the formula, η represents viscosity (Pa·s), A is a constant, R is a gas constant (J/K·mol), and T is the absolute temperature (K).

The thin film-forming varnish has a flow activation energy of not more than 28 kJ/mol. However, in order to reproducibly obtain a thin film having a high flatness, the flow activation energy is preferably not more than 25 kJ/mol, and more preferably not more than 23 kJ/mol. Although the flow activation energy has no particular lower limit, in view of such considerations as the ease of application by inkjet printing, it is preferably at least 15 kJ/mol, more preferably at least 16 kJ/mol, even more preferably at least 17 kJ/mol, and still more preferably at least 18 kJ/mol.

The thin film-forming varnish used in the thin film-planarizing method of the invention is exemplified by varnishes for forming organic thin films used in devices such as organic EL devices, solar cells and organic field-effect transistors.

The thin film-forming varnish includes an organic compound and an organic solvent. The organic compound is exemplified by organic compounds generally used in the insulating films, charge-transporting films, protective films and planarized films of electronic devices. The organic compound has a molecular weight of preferably from 200 to 30,000, and is exemplified by low-molecular-weight compounds having a molecular weight of 200 to 1,000, oligomers having a molecular weight of 200 to 5,000, and polymers having a molecular weight of more than 5,000 and not more than 30,000. The molecular weight of a polymer refers here to the weight-average molecular weight. As used herein, "weight-average molecular weight" refers to the polystyrene-equivalent weight-average molecular weight based on gel permeation chromatography.

The thin film-forming varnish of the invention has a flow activation energy of not more than 28 kJ/mol. Because the flow activation energy of the varnish is influenced by, for example, the types and concentration of the organic compound used and by the type of solvent used, it is necessary in this invention to suitably select the solvent and organic compound serving as varnish ingredients such that the flow activation energy becomes not more than 28 kJ/mol. Examples of methods for preparing a varnish having the desired flow activation energy include, but are not limited to, the technique of providing a solvent having a flow activation energy close to the desired value and dissolving therein the organic compound, and the technique of dissolving the organic compound in a solvent having a high solvency and subsequently adding another solvent such that the varnish has a flow activation energy of the desired value.

The organic solvent used when preparing the thin film-forming varnish is not particularly limited, provided it has a flow activation energy such that the flow activation energy of the thin film-forming varnish becomes 28 kJ/mol or less. In order to prepare a varnish having the target flow activation energy, in general, the flow activation energy of the solvent is preferably not more than 27 kJ/mol, more preferably not more than 24 kJ/mol, and even more preferably not more than 22 kJ/mol. Although the flow activation energy has no particular lower limit, in view of such considerations as the ease of application by inkjet printing, it is preferably at least 14 kJ/mol, more preferably at least 15 kJ/mol, even more preferably at least 16 kJ/mol, and still more preferably at least 17 kJ/mol.

Specific examples of the organic solvent include N,N-dimethylformamide, N,N-dimethylacetamide, N-methylpyrrolidone, 1,3-dimethyl-2-imidazolidinone, dimethylsulfoxide and N-cyclohexyl-2-pyrrolidinone; aromatic hydrocarbons (e.g., benzene, toluene, ethylbenzene, p-xylene, o-xylene, styrene); ketones (acetone, methyl ethyl ketone, methyl isopropyl ketone, diethyl ketone, methyl isobutyl ketone, methyl n-butyl ketone, cyclohexanone, ethyl n-amyl ketone); esters (ethyl acetate, isopropyl acetate ketone, n-propyl acetate, isobutyl acetate, n-butyl acetate, n-amyl acetate, n-hexyl acetate, methyl caproate, 2-methylpenyl acetate, ethyl lactate, n-butyl lactate, etc.); glycol esters and glycol ethers (ethylene glycol dimethyl ether, propylene glycol monomethyl ether, ethylene glycol monomethyl ether, propylene glycol monoethyl ether, ethylene glycol monoethyl ether, ethylene glycol monoisopropyl ether, ethylene glycol diglycidyl ether, ethylene glycol methyl ether acetate, propylene glycol monomethyl ether acetate, ethylene glycol ethyl ether acetate, diethylene glycol dimethyl ether, propylene glycol monobutyl ether, ethylene glycol monobutyl ether, diethylene glycol diethyl ether, dipropylene glycol monomethyl ether, diethylene glycol monomethyl ether, dipropylene glycol monoethyl ether, diethylene glycol monoethyl ether, triethylene glycol dimethyl ether, diethylene glycol monoethyl ether acetate, diethylene glycol monobutyl ether acetate, etc.); alcohols (methanol, ethanol, isopropanol, t-butanol, allyl alcohol, 1-propanol, 2-methyl-2-butanol, isobutanol, 1-butanol, 2-methyl-1-butanol, 1-pentanol, 2-methyl-1-pentanol, 2-ethylhexanol, 1-octanol, ethylene glycol, diethylene glycol, dipropylene glycol, trimethylene glycol, triethylene glycol, tripropylene glycol, hexylene glycol, 1,3-octylene glycol, 1-methoxy-2-butanol, cyclohexanol, diacetone alcohol, furfuryl alcohol, tetrahydrofurfuryl alcohol, propylene glycol, hexylene glycol, benzyl alcohol, 1,3-butanediol, 2,3-butanediol, 1,4-butanediol, etc.); phenols (anisole, phenol, m-cresol, etc.); and ethers and carboxylic acids (isopropyl ether, 1,4-dioxane, acetic acid, γ-butyrolactone, etc.). The organic solvent may be a single solvent or may be a mixed solvent.

The method of forming a planarized thin film using such a thin film-forming varnish includes the step of coating a substrate with a thin film-forming varnish having a flow activation energy of not more than 28 kJ/mol, and a baking step.

Examples of methods for applying the varnish include, but are not particularly limited to, dipping, spin coating, transfer printing, roll coating, brush coating, inkjet printing, spraying and slit coating. The viscosity and surface tension of the varnish are preferably adjusted according to the coating method.

The atmosphere when baking the varnish is not particularly limited, although a thin film having a high flatness can be obtained not only in an open-air atmosphere, but even in an inert gas such as nitrogen or in a vacuum.

The baking temperature is suitably set in the range of about 100 to 260° C. while taking into account such factors as the intended use of the resulting thin film, the qualities to be imparted to the resulting thin film, and the boiling point of the solvent. For example, when the resulting thin film is to be used as a hole injection layer in an organic EL device, the baking temperature is preferably from about 140 to about 250° C., and more preferably from about 145 to about 240° C.

During baking, a temperature change in two or more steps may be applied for such purposes as to achieve more uniform film formability or to induce the reaction to proceed on the substrate. Heating may be carried out using a suitable apparatus such as a hot plate or an oven.

The thickness of the thin film is not particularly limited, but is generally set, within the range of 1 to 200 nm, according to the intended use of the thin film.

Next, the invention is concretely described for a case in which, by way of illustration, the thin film-forming varnish is a charge-transporting varnish.

The charge-transporting varnish is a varnish for forming a charge-transporting (electrically conductive) thin-film by a wet process, and includes both a charge-transporting substance that is an organic compound and an organic solvent. The charge-transporting substance, although not particularly limited, is typically exemplified by charge-transporting oligomers such as aniline derivatives, thiophene derivatives and pyrrole derivatives. Of these, taking into account the balance between the solubility in an organic solvent and the charge transportability of the resulting thin film, an aniline derivative is preferred.

The molecular weight of the charge-transporting oligomer is generally from 200 to 5,000. However, from the standpoint of preparing a varnish that gives a thin film having high charge transportability, the molecular weight is preferably not more than 300, more preferably not more than 400, and even more preferably not more than 500. From the standpoint of preparing a uniform varnish that gives a thin film having a high flatness, the molecular weight is preferably not more than 4,000, more preferably not more than 3,000, and even more preferably not more than 2,000.

Exemplary aniline derivatives include the oligoaniline derivatives mentioned in JP-A 2002-151272, the oligoaniline compounds mentioned in WO 2004/105446, the oligoaniline compounds mentioned in WO 2008/032617, the oligoaniline compounds mentioned in WO 2008/032616, and the aryldiamine compounds mentioned in WO 2013/042623.

In this invention, preferred use can be made of, for example, aniline derivatives of formula (1) below.

Illustrative examples of alkenyl groups of 2 to 20 carbon atoms include ethenyl, n-1-propenyl, n-2-propenyl, 1-methylethenyl, n-1-butenyl, n-2-butenyl, n-3-butenyl, 2-methyl-1-propenyl, 2-methyl-2-propenyl, 1-ethylethenyl, 1-methyl-1-propenyl, 1-methyl-2-propenyl, n-1-pentenyl, n-1-decenyl and n-1-eicosenyl groups.

Illustrative examples of alkynyl groups of 2 to 20 carbon atoms include ethynyl, n-1-propynyl, n-2-propynyl, n-1-butynyl, n-2-butynyl, n-3-butynyl, 1-methyl-2-propynyl, n-1-pentynyl, n-2-pentynyl, n-3-pentynyl, n-4-pentynyl, 1-methyl-n-butynyl, 2-methyl-n-butynyl, 3-methyl-n-butynyl, 1,1-dimethyl-n-propynyl, n-1-hexynyl, n-1-decynyl, n-1-pentadecynyl and n-1-eicosynyl groups.

Illustrative examples of aryl groups of 6 to 20 carbon atoms include phenyl, 1-naphthyl, 2-naphthyl, 1-anthryl, 2-anthryl, 9-anthryl, 1-phenanthryl, 2-phenanthryl, 3-phenanthryl, 4-phenanthryl and 9-phenanthryl groups.

Illustrative examples of heteroaryl groups of 2 to 20 carbon atoms include 2-thienyl, 3-thienyl, 2-furanyl, 3-furanyl, 2-oxazolyl, 4-oxazolyl, 5-oxazolyl, 3-isooxazolyl, 4-isooxazolyl, 5-isooxazolyl, 2-thiazolyl, 4-thiazolyl, 5-thiazolyl, 3-isothiazolyl, 4-isothiazolyl, 5-isothiazolyl, 2-imidazolyl, 4-imidazolyl, 2-pyridyl, 3-pyridyl and 4-pyridyl groups.

$R^7$ and $R^8$ are each independently a hydrogen atom, a halogen atom, a nitro group, a cyano group, an amino group, an aldehyde group, a hydroxyl group, a thiol group, a sulfonic acid group, a carboxylic acid group, an alkyl group of 1 to 20 carbon atoms, alkenyl group of 2 to 20 carbon atoms or alkynyl group of 2 to 20 carbon atoms which may be substituted with $Z^1$, an aryl group of 6 to 20 carbon atoms or heteroaryl group of 2 to 20 carbon atoms which may be substituted with $Z^2$, or a —$NHY^2$, —$NY^3Y^4$, —$C(O)Y^5$, —$OY^6$, —$SY^7$, —$SO_3Y^8$, —$C(O)OY^9$, —$OC(O)Y^{10}$, —$C(O)NHY^{11}$ or —$C(O)NY^{12}Y^{13}$ group.

[Chemical Formula 1]

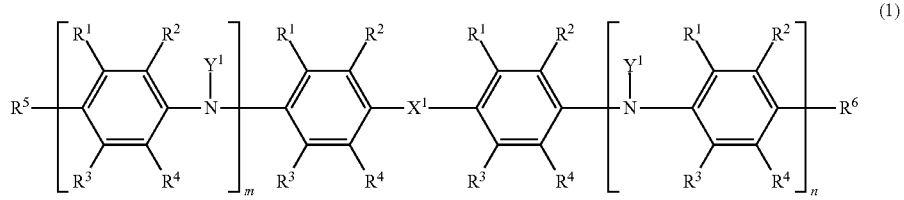

In formula (1), $X^1$ represents —$NY^1$—, —O—, —S—, —$(CR^7R^8)_L$— or a single bond. When m or n is 0, $X^1$ represents —$NY^1$—.

Each $Y^1$ is independently a hydrogen atom, an alkyl group of 1 to 20 carbon atoms, alkenyl group of 2 to 20 carbon atoms or alkynyl group of 2 to 20 carbon atoms which may be substituted with $Z^1$, or an aryl group of 6 to 20 carbon atoms or heteroaryl group of 2 to 20 carbon atoms which may be substituted with $Z^2$.

The alkyl group of 1 to 20 carbon atoms may be linear, branched or cyclic, and is exemplified by linear or branched alkyl groups of 1 to 20 carbon atoms such as methyl, ethyl, n-propyl, isopropyl, n-butyl, isobutyl, s-butyl, t-butyl, n-pentyl, n-hexyl, n-heptyl, n-octyl, n-nonyl and n-decyl groups; and cyclic alkyl groups of 3 to 20 carbon atoms such as cyclopropyl, cyclobutyl, cyclopentyl, cyclohexyl, cycloheptyl, cyclooctyl, cyclononyl, cyclodecyl, bicyclobutyl, bicyclopentyl, bicyclohexyl, bicycloheptyl, bicyclooctyl, bicyclononyl and bicyclodecyl groups.

$Y^2$ to $Y^{13}$ are each independently an alkyl group of 1 to 20 carbon atoms, alkenyl group of 2 to 20 carbon atoms or alkynyl group of 2 to 20 carbon atoms which may be substituted with $Z^1$, or an aryl group of 6 to 20 carbon atoms or heteroaryl group of 2 to 20 carbon atoms which may be substituted with $Z^2$.

$Z^1$ is a halogen atom, a nitro group, a cyano group, an amino group, an aldehyde group, a hydroxyl group, a thiol group, a sulfonic acid group, a carboxylic acid group, or an aryl group of 6 to 20 carbon atoms or heteroaryl group of 2 to 20 carbon atoms which may be substituted with $Z^3$.

$Z^2$ is a halogen atom, a nitro group, a cyano group, an amino group, an aldehyde group, a hydroxyl group, a thiol group, a sulfonic acid group, a carboxylic acid group, or an alkyl group of 1 to 20 carbon atoms, alkenyl group of 2 to 20 carbon atoms or alkynyl group of 2 to 20 carbon atoms which may be substituted with $Z^3$.

$Z^3$ is a halogen atom, a nitro group, a cyano group, an amino group, an aldehyde group, a hydroxyl group, a thiol group, a sulfonic acid group or a carboxylic acid group.

Examples of halogen atoms include fluorine, chlorine, bromine and iodine atoms. The alkyl groups, alkenyl groups, alkynyl groups, aryl groups and heteroaryl groups of $R^7$ to $R^8$ and $Y^2$ to $Y^{13}$ are exemplified in the same way as above.

Of these, $R^7$ and $R^8$ are preferably hydrogen atoms or alkyl groups of 1 to 20 carbon atoms which may be substituted with $Z^1$, more preferably hydrogen atoms or methyl groups which may be substituted with $Z^1$, and most preferably both hydrogen atoms.

L, which represents the number of divalent group recurring units represented as —$(CR^7R^8)$—, is an integer from 1 to 20, preferably from 1 to 10, more preferably from 1 to 5, even more preferably 1 or 2, and most preferably 1. When L is 2 or more, the plurality of $R^7$ groups may be mutually the same or different, and the plurality of $R^8$ groups may be mutually the same or different.

In particular, $X^1$ is preferably —$NY^1$— or a single bond. $Y^1$ is preferably a hydrogen atom or an alkyl group of 1 to 20 carbon atoms which may be substituted with $Z^1$, more preferably a hydrogen atom or a methyl group which may be substituted with $Z^1$, and most preferably a hydrogen atom.

$R^1$ to $R^6$ are each independently a hydrogen atom, a halogen atom, a nitro group, a cyano group, an amino group, an aldehyde group, a hydroxyl group, a thiol group, a sulfonic acid group, a carboxylic acid group, an alkyl group of 1 to 20 carbon atoms, alkenyl group of 2 to 20 carbon atoms or alkynyl group of 2 to 20 carbon atoms which may be substituted with $Z^1$, an aryl group of 6 to 20 carbon atoms or heteroaryl group of 2 to 20 carbon atoms which may be substituted with $Z^2$, or —$NHY^2$, —$NY^3Y^4$, —$C(O)Y^5$, —$OY^6$, —$SY^7$, —$SO_2Y^8$, —$C(O)OY^9$, —$OC(O)Y^{10}$, $C(O)NHY^{11}$ or —$C(O)NY^{12}Y^{13}$ wherein $Y^2$ to $Y^{13}$ are as defined above). These halogen atoms, alkyl groups, alkenyl groups, alkynyl groups, aryl groups and heteroaryl groups are as defined above.

In particular, in formula (1), $R^1$ to $R^4$ are preferably hydrogen atoms, halogen atoms, alkyl groups of 1 to 10 carbon atoms which may be substituted with $Z^1$, or aryl groups of 6 to 14 carbon atoms which may be substituted with $Z^2$; more preferably hydrogen atoms, fluorine atoms, or alkyl groups of 1 to 10 carbon atoms which may be substituted with fluorine atoms; and most preferably all hydrogen atoms.

$R^5$ and $R^6$ are preferably hydrogen atoms, halogen atoms, alkyl groups of 1 to 10 carbon atoms which may be substituted with $Z^1$, aryl groups of 6 to 14 carbon atoms which may be substituted with $Z^2$, or diphenylamino groups which may be substituted with $Z^2$ (—$NY^3Y^4$ groups wherein $Y^3$ and $Y^4$ are phenyl groups which may be substituted with $Z^2$); more preferably hydrogen atoms, fluorine atoms, or diphenylamino groups which may be substituted with fluorine atoms; and even more preferably both hydrogen atoms or both diphenylamino groups.

Of these, combinations in which $R^1$ to $R^4$ are hydrogen atoms, fluorine atoms or alkyl groups of 1 to 10 carbon atoms which may be substituted with fluorine atoms, $R^5$ and $R^6$ are hydrogen atoms, fluorine atoms or diphenylamino groups which may be substituted with fluorine atoms, $X^1$ is —$NY^1$— or a single bond, and $Y^1$ is a hydrogen atom or a methyl group are preferred. Combinations in which $R^1$ to $R^4$ are hydrogen atoms, $R^5$ and $R^6$ are both hydrogen atoms or diphenylamino groups, and $X^1$ is —NH— or a single bond are more preferred.

In formula (1), m and n independently represent an integer of 0 or more and satisfy the condition 1≤m+n≤20. Taking into account the balance between the charge transportability of the resulting thin film and the solubility of the aniline derivative, m and n preferably satisfy the condition 2≤m+n≤8, more preferably satisfy the condition 2≤m+n≤6, and still more preferably satisfy the condition 2≤m+n≤4.

In particular, in $Y^1$ to $Y^{13}$ and $R^1$ to $R^8$, $Z^1$ is preferably a halogen atom or an aryl group of 6 to 20 carbon atoms which may be substituted with $Z^3$, more preferably a halogen atom or a phenyl group which may be substituted with $Z^3$, and most preferably does not exist (i.e., is non-substituting).

$Z^2$ is preferably a halogen atom or an alkyl group of 1 to 20 carbon atoms which may be substituted with $Z^3$, more preferably a halogen atom or an alkyl group of 1 to 4 carbon atoms which may be substituted with $Z^3$, and most preferably does not exist (i.e., is non-substituting).

$Z^3$ is preferably a halogen atom, more preferably fluorine, and most preferably does not exist (i.e., is non-substituting).

In $Y^1$ to $Y^{13}$ and $R^1$ to $R^8$, the number of carbon atoms on the alkyl, alkenyl and alkynyl groups is preferably 10 or less, more preferably 6 or less, and even more preferably 4 or less. The number of carbon atoms on the aryl and heteroaryl groups is preferably 14 or less, more preferably 10 or less, and even more preferably 6 or less.

The aniline derivative of formula (1) has a molecular weight which, from the standpoint of preparing a uniform varnish which provides a thin film of high flatness, is preferably not more than 4,000, more preferably not more than 3,000, and even more preferably not more than 2,000.

Examples of methods for synthesizing the aniline derivative include, but are not particularly limited to, the methods described in *Bulletin of Chemical Society of Japan*, 67, pp. 1749-1752 (1994); *Synthetic Metals*, 84, pp. 119-120 (1997); *Thin Solid Films*, 520 (24), pp. 7157-7163 (2012), WO 2008/032617, WO 2008/032616 and WO 2008/129947.

Examples of aniline derivatives of formula (1) include, but are not limited to, those of the following formulas. In these formulas, DPA stands for a diphenylamino group, Ph stands for a phenyl group, and TPA stands for a p-(diphenylamino)phenyl group.

[Chemical Formula 2]

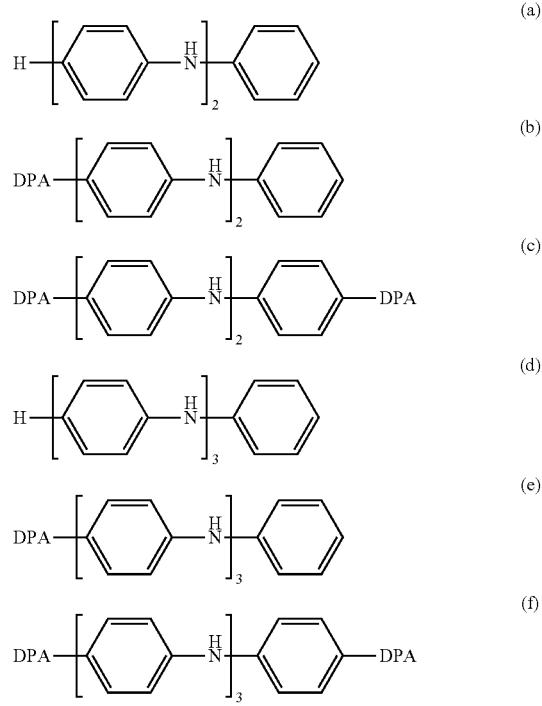

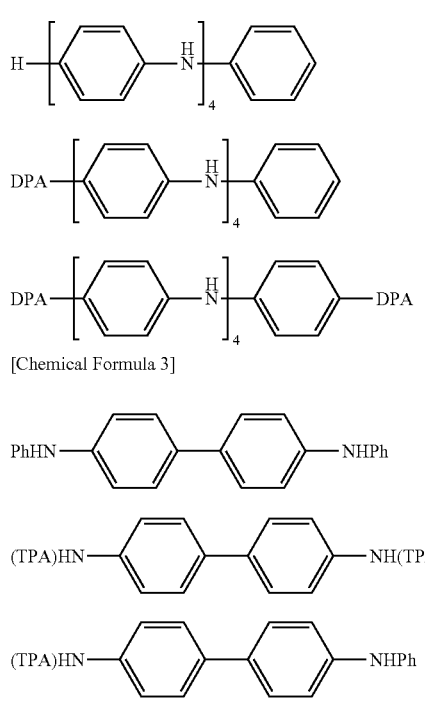

[Chemical Formula 3]

(j) PhHN—〈benzene〉—〈benzene〉—NHPh (k) (TPA)HN—〈benzene〉—〈benzene〉—NH(TPA)

(l) (TPA)HN—〈benzene〉—〈benzene〉—NHPh

The content of charge-transporting substance in the varnish of the invention is not particularly limited, provided it is an amount such that the flow activation energy of the varnish becomes not more than 28 kJ/mol, although it is generally preferable for the content to be from about 0.1 to about 20 wt %.

The organic solvent used when preparing the charge-transporting varnish is suitably selected while taking into account, for example, the types and concentrations of the charge-transporting substance and the subsequently described dopant, such that the flow activation energy of the varnish becomes not more than 28 kJ/mol. In particular, taking into account the fact that a uniform varnish which reproducibly provides a thin film having a high flatness is to be prepared, it is preferable to use a high-solvency solvent that can dissolve well the charge-transporting substance and the subsequently described dopant, etc.

Examples of such high-solvency solvents include, but are not limited to, organic solvents such as cyclohexanone, N,N-dimethylformamide, N,N-dimethylacetamide, N-methylpyrrolidone and 1,3-dimethyl-2-imidazolidinone. These solvents may be used singly or two or more may be mixed and used together. The amount of use may be set to from 5 to 100 wt % of all the solvent used in the varnish.

At least one high-viscosity organic solvent having a viscosity at 25° C. of 10 to 200 mPa·s, especially 35 to 150 mPa·s, and a boiling point at normal pressure (atmospheric pressure) of 50 to 300° C., especially 150 to 250° C., may be included in the varnish. By adding such a solvent, adjustment of the varnish flow activation energy is easy, as a result of which it is possible to prepare a varnish that reproducibly gives a high-flatness thin film.

Illustrative examples of high-viscosity organic solvents include, but are not limited to, cyclohexanol, ethylene glycol, ethylene glycol diglycidyl ether, 1,3-octylene glycol, diethylene glycol, dipropylene glycol, triethylene glycol, tripropylene glycol, 1,3-butanediol, 2,3-butanediol, 1,4-butanediol, propylene glycol and hexylene glycol.

The proportion in which a high-viscosity organic solvent is added to the solvent used in the inventive varnish is preferably in a range where no solids precipitate out. The proportion of such addition is preferably from 5 to 90 wt %, provided that solids do not precipitate out.

In addition, other solvents may be admixed in a proportion with respect to the overall solvent used in the varnish of 1 to 90 mass %, and preferably 1 to 50 mass %, for such purposes as to enhance the substrate wettability by the varnish, adjust the solvent surface tension, adjust the polarity, and adjust the boiling point.

Illustrative examples of such solvents include, but are not limited to, propylene glycol monomethyl ether, ethylene glycol monobutyl ether, diethylene glycol diethyl ether, diethylene glycol monomethyl ether, diethylene glycol dimethyl ether, diethylene glycol monoethyl ether acetate, diethylene glycol monobutyl ether acetate, dipropylene glycol monomethyl ether, propylene glycol monomethyl ether acetate, diethylene glycol monoethyl ether, diacetone alcohol, γ-butyrolactone, ethyl lactate and n-hexyl acetate. These solvents may be used singly or two or more may be mixed and used together.

Depending on the intended use for the resulting thin film, a dopant may be included in the charge-transporting varnish so as to, for example, increase the charge transportability of the thin film. The dopant used may be either an inorganic dopant or an organic dopant. The inorganic and organic dopants may be used singly or two or more may be used in combination.

From the standpoint of reproducibly obtaining a thin film that provides a high flatness when a charge-transporting oligomer is used, exemplary inorganic dopants include heteropolyacids.

Illustrative examples of heteropolyacids include phosphomolybdic acid, silicomolybdic acid, phosphotungstic acid, silicotungstic acid and phosphotungstomolybdic acid. These may be used singly or two or more may be used in combination. These heteropolyacids may be acquired as commercial products or may be synthesized by known methods. Even a heteropolyacid having, in quantitative analysis such as elemental analysis, numbers for the elements which are higher or lower than in the structure indicated by the general formula may be used in this invention, provided it was acquired as a commercial product or was suitably synthesized according to a known method of synthesis.

For example, phosphotungstic acid is generally represented by the chemical formula $H_3(PW_{12}O_{40})\cdot nH_2O$ and phosphomolybdic acid is generally represented by the chemical formula $H_3(PMo_{12}O_{40})\cdot nH_2O$. In quantitative analysis, regardless of whether the numbers for the elements P (phosphorus), O (oxygen) and W (tungsten) or Mo (molybdenum) within these formulas are high or low, so long as the heteropolyacid was acquired as a commercial product or suitably synthesized by a known method of synthesis, it may be used in this invention. In such cases, the mass of the heteropolyacid specified in this invention refers not to the mass of pure phosphotungstic acid within the product of synthesis or the commercial product (phosphotungstic acid content), but rather, in the form that is available as a commercial product or the form that can be isolated by a known method of synthesis, to the total mass in a state that includes water of hydration and other impurities.

From the standpoint of reproducibly obtaining a thin film that provides a high flatness when used together with a charge-transporting oligomer, especially preferred organic dopants include arylsulfonic acid compounds, tetracyanoquinodimethane derivatives and benzoquinone derivatives.

Examples of arylsulfonic acid compounds include benzenesulfonic acid, tosylic acid, p-styrenesulfonic acid, 2-naphthalenesulfonic acid, 4-hydroxybenzenesulfonic acid, 5-sulfosalicyclic acid, p-dodecylbenzenesulfonic acid, dihexylbenzenesulfonic acid, 2,5-dihexylbenzenesulfonic acid, dibutylnaphthalenesulfonic acid, 6,7-dibutyl-2-naphthalenesulfonic acid, dodecylnaphthalenesulfonic acid, 3-dodecyl-2-naphthalenesulfonic acid, hexylnaphthalenesulfonic acid, 4-hexyl-1-naphthalenesulfonic acid, octylnaphthalenesulfonic acid, 2-octyl-1-naphthalenesulfonic acid, hexylnaphthalenesulfonic acid, 7-hexyl-1-naphthalenesulfonic acid, 6-hexyl-2-naphthalenesulfonic acid, dinonylnaphthalenesulfonic acid, 2,7-dinonyl-4-naphthalenesulfonic acid, dinonylnaphthalenedisulfonic acid, 2,7-dinonyl-4,5-naphthalenedisulfonic acid, the 1,4-benzodioxanedisulfonic acid compounds mentioned in WO 2005/000832, the arylsulfonic acid compounds mentioned in WO 2006/025342 and the arylsulfonic acid compounds mentioned in WO 2009/096352. The arylsulfonic acid compound has a molecular weight which, taking into account the solubility in organic solvents, is preferably not more than 3,000, and more preferably not more than 2,000.

Examples of benzoquinone derivatives include tetrafluoro-1,4-benzoquinone, tetrachloro-1,4-benzoquinone (chloranil), tetrabromo-1,4-benzoquinone and 2,3-dichloro-5,6-dicyano-1,4-benzoquinone (DDQ).

Examples of tetracyanoquinodimethane derivatives include 7,7,8,8-tetracyanoquinodimethane (TCNQ), and halotetracyanoquinodimethanes such as 2-fluoro-7,7,8,8-tetracyanoquinodimethane, 2-chloro-7,7,8,8-tetracyanoquinodimethane, 2,5-difluoro-7,7,8,8-tetracyanoquinodimethane, 2,5-dichloro-7,7,8,8-tetracyanoquinodimethane, 2,3,5,6-tetrachloro-7,7,8,8-tetracyanoquinodimethane and 2,3,5,6-tetrafluoro-7,7,8,8-tetracyanoquinodimethane (F4TCNQ).

In particular, because they exhibit a good solubility in organic solvents when used together with charge-transporting oligomers such as aniline derivatives and thiophene derivatives, in cases where the varnish is prepared using a dopant, arylsulfonic acid compounds, heteropolyacids and the like are preferred as the dopant.

The amount of dopant included is determined by taking into account the types and amounts of charge-transporting substance and solvent used together, and therefore cannot be strictly specified. However, expressed as a weight ratio relative to unity (1) for the charge-transporting substance, this is generally in the range of from 0.0001 to 20.

Specific examples of preferred dopants include, but are not limited to, the following.

[Chemical Formula 4]

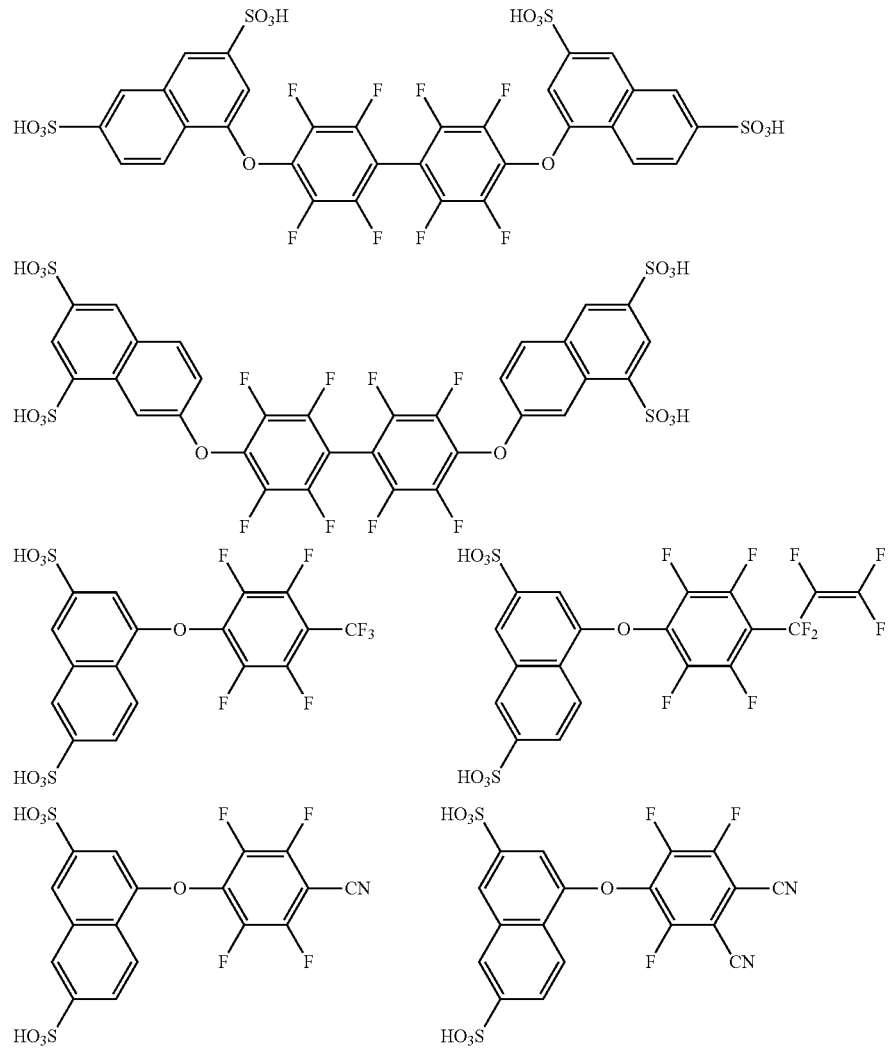

To reproducibly obtain a thin film having a high flatness, it is preferable for the charge-transporting substance and the dopant to be dissolved in the varnish solvent.

In addition to the charge-transporting substance and the dopant, the charge transporting varnish of the invention may include other ingredients for such purposes as to adjust the surface tension or viscosity of the varnish. In this case as well, it is critical for the flow activation energy of the varnish to be not more than 28 kJ/mol. To reproducibly obtain a thin film having a high flatness, such other ingredients also are preferably dissolved in the varnish solvent.

By using the charge-transporting varnish described above, a charge-transporting thin film having a high flatness can be formed not only on a large-surface-area substrate that is free of structures, but even within small regions such as within pixels on a pixel substrate having banks. Hence, the charge-transporting varnish is suitable for coating the thin film required to have such flatness, including hole injection layers and other functional thin films in organic EL devices, and anode buffer layers in organic thin-film solar cells.

EXAMPLES

Production Examples and Working Examples are given below to more concretely illustrate the invention, although the invention is not limited by these Examples. The equipment used in the Working Examples and Comparative Examples were as follows.

(1) Substrate Cleaning:
  Substrate cleaning machine (reduced-pressure plasma system), from Choshu Industry Co., Ltd.
(2) Rheometer:
  MCR 302, from Anton Paar GmbH
(3) Varnish Coating:
  MS-A100 Spin Coater, from Mikasa Co., Ltd.
(4) Flatness Measurement:
  Surfcorder ET-4000 microfigure measuring instrument, from Kosaka Laboratory, Ltd.

[1] Synthesis of Charge-Transporting Varnish Ingredients

Synthesis Example 1

The aniline derivative of formula (2) below and the arylsulfonic acid of formula (3) below were synthesized according to the methods described in, respectively, WO 2013/084664 and WO 2006/025342.

[Chemical Formula 5]

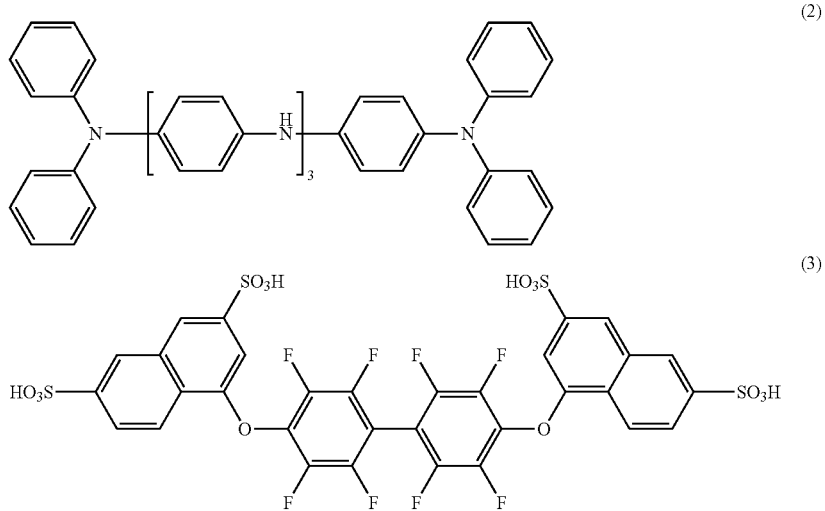

[2] Preparation of Charge-Transporting Varnish

Working Example 1

Preparation of Charge-Transporting Varnish A

Charge-Transporting Varnish A was prepared by dissolving 0.137 g of the aniline derivative of formula (2) and 0.271 g of the arylsulfonic acid of formula (3) in 6.0 g of 1,3-dimethyl-2-imidazolidinone under a nitrogen atmosphere, and then successively adding 6.0 g of diethylene glycol and 8.0 g of diethylene glycol monomethyl ether to the resulting solution and stirring.

Working Example 2

Preparation of Charge-Transporting Varnish B

Aside from changing the solvent to 6.0 g of 1,3-dimethyl-2-imidazolidinone, 9.0 g of dipropylene glycol monomethyl ether and 5.0 g of hexylene glycol, Charge-Transporting Varnish B was prepared by the same method as in Working Example 1.

Working Example 3

Preparation of Charge-Transporting Varnish C

Aside from changing the solvent to 6.0 g of 1,3-dimethyl-2-imidazolidinone, 10.0 g of diethylene glycol and 4.0 g of diethylene glycol monomethyl ether, Charge-Transporting Varnish C was prepared by the same method as in Working Example 1.

Working Example 4

Preparation of Charge-Transporting Varnish D

Aside from changing the solvent to 8.0 g of 1,3-dimethyl-2-imidazolidinone, 9.0 g of 2,3-butanediol and 3.0 g of diethylene glycol monoethyl ether, Charge-Transporting Varnish D was prepared by the same method as in Working Example 1.

Working Example 5

Preparation of Charge-Transporting Varnish E

Aside from changing the solvent to 6.6 g of 1,3-dimethyl-2-imidazolidinone, 8.0 g of 2,3-butanediol and 5.4 g of dipropylene glycol monoethyl ether, Charge-Transporting Varnish E was prepared by the same method as in Working Example 1.

Comparative Example 1

Preparation of Charge-Transporting Varnish F

Aside from changing the solvent to 6.6 g of 1,3-dimethyl-2-imidazolidinone, 10.0 g of cyclohexanol and 3.4 g of 2,3-butanediol, Charge-Transporting Varnish F was prepared by the same method as in Working Example 1.

[3] Calculation of Flow Activation Energy

The viscosities ($\eta$) of Charge-Transporting Varnishes A to F at 20 to 100° C. were measured using a rheometer. Next, given that Andrade's formula, when modified, is expressed as indicated below, using the resulting measured values, ln $\eta$ was plotted versus 1/T, and the flow activation energy E of the varnish was calculated. The least squares method was used for calculation.

$$\text{Ln } \eta = \ln A + (E/R/T)$$

Also, using the same method, the viscosities ($\eta$) of only the solvents used in preparing Charge-Transporting Varnishes A to F were measured, and the flow activation energies $E_s$ of the solvents were calculated. The results are shown in Table 1.

[4] Evaluation of Flatness within Pixel

Charge-Transporting Varnishes A to F were applied with a spin coater onto ITO substrates having structures with a pixel width (between the structures) of 50×100 μm that were created using a positive-working photosensitive polyimide, then heated in open air at 80° C. on a hot plate and dried for 1 minute, and subsequently baked under applied heat at 230° C. for 15 minutes, thereby forming a film. The maximum step ($R_{max}$) of the film in the pixel portion was measured with a Surfcorder ET-4000 microfigure measuring instrument. The results are presented in Table 1. Film profiles within pixels are shown in the FIGURE.

As shown in Table 1, given that the film produced from Charge-Transporting Varnish A having the smallest flow activation energy has the smallest maximum step and the size of the maximum step becomes larger as the flow activation energy rises, it is apparent that the film flatness can be increased by making the flow activation energy of the charge-transporting varnish small.

The invention claimed is:

1. A method of preparing a thin film formed using a thin film-forming varnish containing an organic compound and an organic solvent, said method comprising:
   setting the varnish to a flow activation energy of not more than 28 kJ/mol and a maximum step ($R_{max}$) of not more than 14.0 nm when the thin film is formed onto ITO substrates having structures with a pixel width of 50×100 μm.

2. The method of preparing a thin film according to claim 1, wherein the organic compound has a molecular weight of from 200 to 30,000.

3. The method of preparing a thin film of claim 1, wherein the thin film-forming varnish is a charge-transporting varnish, which comprises a charge transporting substance selected from the group consisting of aniline derivatives, thiophene derivatives and pyrrole derivatives, together with an organic solvent.

4. A method of preparing a thin film, said method comprising:
   applying a thin film-forming varnish comprising an organic compound and an organic solvent onto a substrate, wherein the varnish has a flow activation energy of not more than 28 kJ/mol and a maximum step ($R_{max}$) of not more than 14.0 nm when the thin film is formed onto ITO substrates having structures with a pixel width of 50×100 μm.

5. The method of preparing a thin film of claim 4, wherein the thin film-forming varnish is a charge-transporting varnish, which comprises a charge transporting substance selected from the group consisting of aniline derivatives, thiophene derivatives and pyrrole derivatives, together with an organic solvent.

6. The method of preparing a thin film of claim 4, wherein the substrate is a pixel substrate.

7. A thin film-forming method comprising the steps of:
   coating a substrate with a thin film-forming varnish containing an organic compound and an organic solvent; and
   evaporating off the solvent,
   wherein the varnish has a flow activation energy of not more than 28 kJ/mol.

8. The thin film-forming method of claim 7, wherein the organic compound has a molecular weight of from 200 to 30,000.

9. The thin film-forming method of claim 7, wherein a maximum step ($R_{max}$) of the film formed onto ITO substrates having structures with a pixel width of 50×100 μm is not more than 14.0 nm.

10. The thin film-forming method of claim 7, wherein the thin film-forming varnish is a charge-transporting varnish,

TABLE 1

| | Working Example 1 Varnish A | Working Example 2 Varnish B | Working Example 3 Varnish C | Working Example 4 Varnish D | Working Example 5 Varnish E | Comparative Example 1 Varnish F |
|---|---|---|---|---|---|---|
| E (kJ/mol) | 22.1 | 23.0 | 24.6 | 25.3 | 27.8 | 29.3 |
| $E_s$ (kJ/mol) | 21.7 | 21.9 | 23.6 | 25.6 | 27.0 | 28.6 |
| $R_{max}$ (nm) | 1.4 | 5.4 | 7.1 | 10.9 | 14.0 | 22.7 | which comprises a charge transporting substance selected from the group consisting of aniline derivatives, thiophene derivatives and pyrrole derivatives, together with an organic solvent.

11. The thin film-forming method of claim 10, wherein the charge transporting substance is an aniline derivative represented by the following formula (1):

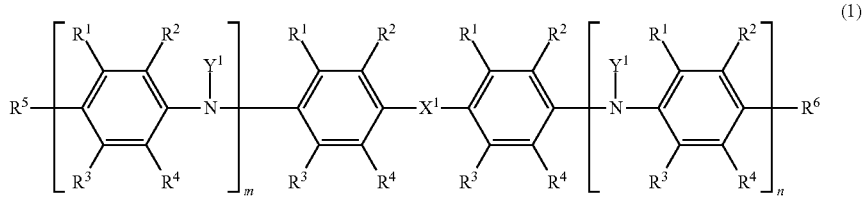

wherein $X^1$ represents —$NY^1$—, —O—, —S—, —$(CR^7R^8)_L$— or a single bond, when m or n is 0, $X^1$ represents —$NY^1$—;

each $Y^1$ is independently a hydrogen atom, an alkyl group of 1 to 20 carbon atoms, alkenyl group of 2 to 20 carbon atoms or alkynyl group of 2 to 20 carbon atoms which may be substituted with $Z^1$, or an aryl group of 6 to 20 carbon atoms or heteroaryl group of 2 to 20 carbon atoms which may be substituted with $Z^2$;

$R^7$ and $R^8$ are each independently a hydrogen atom, a halogen atom, a nitro group, a cyano group, an amino group, an aldehyde group, a hydroxyl group, a thiol group, a sulfonic acid group, a carboxylic acid group, an alkyl group of 1 to 20 carbon atoms, alkenyl group of 2 to 20 carbon atoms or alkynyl group of 2 to 20 carbon atoms which may be substituted with $Z^1$, an aryl group of 6 to 20 carbon atoms or heteroaryl group of 2 to 20 carbon atoms which may be substituted with $Z^2$, or a —$NHY^2$, —$NY^3Y^4$, —$C(O)Y^5$, —$OY^6$, —$SY^7$, —$SO_3Y^8$, —$C(O)OY^9$, —$OC(O)Y^{10}$, —$C(O)NHY^{11}$ or —$C(O)NY^{12}Y^{13}$ group;

L, which represents the number of divalent group recurring units represented as —$(CR^7R^8)$—, is an integer from 1 to 20, when L is 2 or more, the plurality of $R^7$ groups may be mutually the same or different, and the plurality of $R^8$ groups may be mutually the same or different;

$R^1$ to $R^6$ are each independently a hydrogen atom, a halogen atom, a nitro group, a cyano group, an amino group, an aldehyde group, a hydroxyl group, a thiol group, a sulfonic acid group, a carboxylic acid group, an alkyl group of 1 to 20 carbon atoms, alkenyl group of 2 to 20 carbon atoms or alkynyl group of 2 to 20 carbon atoms which may be substituted with $Z^1$, an aryl group of 6 to 20 carbon atoms or heteroaryl group of 2 to 20 carbon atoms which may be substituted with $Z^2$, or —$NHY^2$, —$NY^3Y^4$, —$C(O)Y^5$, —$OY^6$, —$SY^7$, —$SO_3Y^8$, —$C(O)OY^9$, —$OC(O)Y^{10}$, —$C(O)NHY^{11}$ or —$C(O)NY^{12}Y^{13}$;

$Y^2$ to $Y^{13}$ are each independently an alkyl group of 1 to 20 carbon atoms, alkenyl group of 2 to 20 carbon atoms or alkynyl group of 2 to 20 carbon atoms which may be substituted with $Z^1$, or an aryl group of 6 to 20 carbon atoms or heteroaryl group of 2 to 20 carbon atoms which may be substituted with $Z^2$;

$Z^1$ is a halogen atom, a nitro group, a cyano group, an amino group, an aldehyde group, a hydroxyl group, a thiol group, a sulfonic acid group, a carboxylic acid group, or an aryl group of 6 to 20 carbon atoms or heteroaryl group of 2 to 20 carbon atoms which may be substituted with $Z_3$;

$Z^2$ is a halogen atom, a nitro group, a cyano group, an amino group, an aldehyde group, a hydroxyl group, a thiol group, a sulfonic acid group, a carboxylic acid group, or an alkyl group of 1 to 20 carbon atoms, alkenyl group of 2 to 20 carbon atoms or alkynyl group of 2 to 20 carbon atoms which may be substituted with $Z^3$;

$Z^3$ is a halogen atom, a nitro group, a cyano group, an amino group, an aldehyde group, a hydroxyl group, a thiol group, a sulfonic acid group or a carboxylic acid group; and m and n independently represent an integer of 0 or more and satisfy the condition 1≤m+n≤20.

12. The thin film-forming method of claim 7, wherein the substrate is a pixel substrate.

13. A thin film-forming varnish, comprising an organic compound and an organic solvent, wherein the thin film-forming varnish has a flow activation energy of not more than 28 kJ/mol.

14. The thin film-forming varnish of claim 13, wherein the organic compound has a molecular weight of from 200 to 30,000.

15. The thin film-forming varnish of claim 13, wherein the thin film-forming varnish is a charge-transporting varnish which comprises a charge transporting substance selected from the group consisting of aniline derivatives, thiophene derivatives and pyrrole derivatives, together with an organic solvent.

16. The thin film-forming varnish of claim 15, wherein the charge transporting substance is an aniline derivative represented by the following formula (1):

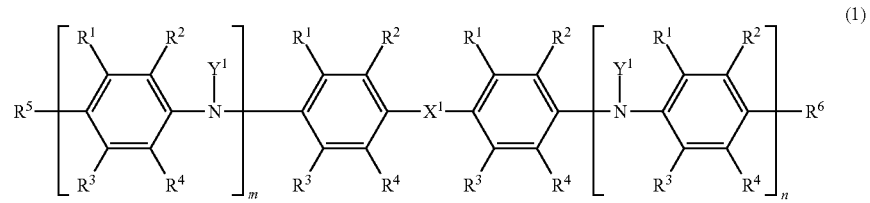

wherein $X^1$ represents —$NY^1$—, —O—, —S—, —$(CR^7R^8)_L$- or a single bond, when m or n is 0, $X^1$ represents —$NY^1$—;

each $Y^1$ is independently a hydrogen atom, an alkyl group of 1 to 20 carbon atoms, alkenyl group of 2 to 20 carbon atoms or alkynyl group of 2 to 20 carbon atoms which may be substituted with $Z^1$, or an aryl group of 6 to 20 carbon atoms or heteroaryl group of 2 to 20 carbon atoms which may be substituted with $Z^2$;

$R^7$ and $R^8$ are each independently a hydrogen atom, a halogen atom, a nitro group, a cyano group, an amino group, an aldehyde group, a hydroxyl group, a thiol group, a sulfonic acid group, a carboxylic acid group, an alkyl group of 1 to 20 carbon atoms, alkenyl group of 2 to 20 carbon atoms or alkynyl group of 2 to 20 carbon atoms which may be substituted with $Z^1$, an aryl group of 6 to 20 carbon atoms or heteroaryl group of 2 to 20 carbon atoms which may be substituted with $Z^2$, or a —$NHY^2$, —$NY^3Y^4$, —$C(O)Y^5$, —$OY^6$, —$SY^7$, —$SO_3Y^8$, —$C(O)OY^9$, —$OC(O)Y^{10}$, —$C(O)NHY^{11}$ or —$C(O)NY^{12}Y^{13}$ group;

L, which represents the number of divalent group recurring units represented as —$(CR^7R^8)$—, is an integer from 1 to 20, when L is 2 or more, the plurality of $R^7$ groups may be mutually the same or different, and the plurality of $R^8$ groups may be mutually the same or different;

$R^1$ to $R^6$ are each independently a hydrogen atom, a halogen atom, a nitro group, a cyano group, an amino group, an aldehyde group, a hydroxyl group, a thiol group, a sulfonic acid group, a carboxylic acid group, an alkyl group of 1 to 20 carbon atoms, alkenyl group of 2 to 20 carbon atoms or alkynyl group of 2 to 20 carbon atoms which may be substituted with $Z^1$, an aryl group of 6 to 20 carbon atoms or heteroaryl group of 2 to 20 carbon atoms which may be substituted with $Z^2$, or —$NHY^2$, —$NY^3Y^4$, —$C(O)Y^5$, —$OY^6$, —$SY^7$, —$SO_3Y^8$, —$C(O)OY^9$, —$OC(O)Y^{10}$, —$C(O)NHY^{11}$ or —$C(O)NY^{12}Y^{13}$;

$Y^2$ to $Y^{13}$ are each independently an alkyl group of 1 to 20 carbon atoms, alkenyl group of 2 to 20 carbon atoms or alkynyl group of 2 to 20 carbon atoms which may be substituted with $Z^1$, or an aryl group of 6 to 20 carbon atoms or heteroaryl group of 2 to 20 carbon atoms which may be substituted with $Z^2$;

$Z^1$ is a halogen atom, a nitro group, a cyano group, an amino group, an aldehyde group, a hydroxyl group, a thiol group, a sulfonic acid group, a carboxylic acid group, or an aryl group of 6 to 20 carbon atoms or heteroaryl group of 2 to 20 carbon atoms which may be substituted with $Z_3$;

$Z^2$ is a halogen atom, a nitro group, a cyano group, an amino group, an aldehyde group, a hydroxyl group, a thiol group, a sulfonic acid group, a carboxylic acid group, or an alkyl group of 1 to 20 carbon atoms, alkenyl group of 2 to 20 carbon atoms or alkynyl group of 2 to 20 carbon atoms which may be substituted with $Z^3$;

$Z^3$ is a halogen atom, a nitro group, a cyano group, an amino group, an aldehyde group, a hydroxyl group, a thiol group, a sulfonic acid group or a carboxylic acid group; and m and n independently represent an integer of 0 or more and satisfy the condition $1 \leq m+n \leq 20$.

\* \* \* \* \*